United States Patent
Li et al.

(10) Patent No.: US 11,936,378 B2
(45) Date of Patent: Mar. 19, 2024

(54) INTERFACE CIRCUIT AND ELECTRONIC APPARATUS

(71) Applicants: NO.24 RESEARCH INSTITUTE OF CHINA ELECTRONICS TECHNOLOGY GROUP CORPORATION, Chongqing (CN); Chongqing GigaChip Technology Co., Ltd., Chongqing (CN)

(72) Inventors: Ting Li, Chongqing (CN); Gangyi Hu, Chongqing (CN); Ruzhang Li, Chongqing (CN); Yong Zhang, Chongqing (CN); Yabo Ni, Chongqing (CN); Dongbing Fu, Chongqing (CN); Jian'an Wang, Chongqing (CN); Guangbing Chen, Chongqing (CN)

(73) Assignees: NO.24 RESEARCH INSTITUTE OF CHINA ELECTRONICS TECHNOLOGY GROUP CORPORATION, Chongqing (CN); Chongqing GigaChip Technology Co., Ltd., Chongqing (CN)

(\*) Notice: Subject to any disclaimer, the term of this patent is extended or adjusted under 35 U.S.C. 154(b) by 0 days.

(21) Appl. No.: 17/925,323

(22) PCT Filed: Jan. 6, 2021

(86) PCT No.: PCT/CN2021/070501
§ 371 (c)(1),
(2) Date: Nov. 15, 2022

(87) PCT Pub. No.: WO2022/062276
PCT Pub. Date: Mar. 31, 2022

(65) Prior Publication Data
US 2023/0216502 A1    Jul. 6, 2023

(30) Foreign Application Priority Data

Sep. 28, 2020    (CN) .......................... 202011037631.2

(51) Int. Cl.
*H03K 19/0185*    (2006.01)
(52) U.S. Cl.
CPC .......................... *H03K 19/018521* (2013.01)
(58) Field of Classification Search
None
See application file for complete search history.

(56) References Cited

U.S. PATENT DOCUMENTS 4,933,644 A    6/1990  Fattaruso et al.
7,532,043 B1 *  5/2009  Butler .................... H04N 7/108
                                                    327/299

(Continued)

FOREIGN PATENT DOCUMENTS

CN         1638369 A    7/2005
CN       104467716 A    3/2015

(Continued)

*Primary Examiner* — Kenneth B Wells
(74) *Attorney, Agent, or Firm* — IPRTOP LLC

(57) ABSTRACT

An interface circuit and an electronic apparatus, including: a programmable current array (1), generating a first current and a second current transmitted to a common mode and differential mode generation circuit (2) according to an input code, and a third current and a fourth current transmitted to a driving bias generation circuit (3) according to the input code; the common mode and differential mode generation circuit (2), generating a common mode voltage according to the first current, and generating a high level voltage and a low level voltage according to the second current and the common mode voltage; a driving bias generation circuit (3), simulating a load according to the third and fourth currents, and generating a bias voltage based on the load and the low and high level voltages; an output driving circuit (4), con- (Continued)

verting an input signal into a differential signal in which the common mode voltage and a differential mode amplitude are configurable.

19 Claims, 10 Drawing Sheets

(56) References Cited

U.S. PATENT DOCUMENTS

| | | | |
|---|---|---|---|
| 10,491,436 B1 * | 11/2019 | Lim | H03K 19/017545 |
| 10,496,591 B2 * | 12/2019 | Han | H03F 3/45183 |
| 2013/0069718 A1 | 3/2013 | Ivanov | |

FOREIGN PATENT DOCUMENTS

| | | |
|---|---|---|
| CN | 108964497 A | 12/2018 |
| CN | 112152606 A | 12/2020 |

* cited by examiner

US 11,936,378 B2

INTERFACE CIRCUIT AND ELECTRONIC APPARATUS

FIELD OF TECHNOLOGY

The present invention relates to the field of integrated circuits, particularly to an interface circuit and an electronic apparatus, which are used to transmit signals and are especially suitable for circuits that transmit data at high speed.

BACKGROUND

With the rapid development of information technology, more and more data need to be collected and processed. Therefore, new requirements are put forward for data transmission. It is necessary to realize a high-speed and low-power data transmission between various modules. However, the traditional interface circuits cannot fully meet the requirements of the signal transmission process, and there are three deficiencies of the traditional interface circuits as follows:
  (1) the output common mode feedback circuit is connected to the output driver, which increases the load of the output driving circuit, resulting in a low transmission rate;
  (2) each output driving circuit is matched with a common mode feedback loop, and the operational amplifier in each feedback loop consumes power, resulting in relatively high power consumption;
  (3) the common mode voltage, signal amplitude, and other characteristics of the output signals are not configurable, and there is less flexibility in use.

SUMMARY

The present invention provides an interface circuit and an electronic apparatus.

In the first aspect, the present invention provides an interface circuit, including:
  a programmable current array, used to generate a first current and a second current transmitted to a common mode and differential mode generation circuit according to an input code, and to generate a third current and a fourth current transmitted to a driving bias generation circuit according to the input code;
  the common mode and differential mode generation circuit, connected to the output end of the programmable current array, used to generate a common mode voltage according to the first current, and to generate a high level voltage and a low level voltage according to the second current and the common mode voltage, where the difference between the high level voltage and the low level voltage is a differential mode voltage;
  a driving bias generation circuit, connected to the output ends of the programmable current array and the common mode and differential mode generation circuit, respectively, used to simulate a load according to the third current and the fourth current, and to generate a bias voltage based on the load, the high level voltage, and the low level voltage;
  an output driving circuit, connected to the bias voltage of the driving bias generation circuit, to convert an input signal into a differential signal in which the common mode voltage and a differential mode amplitude are configurable.

A second aspect of the present invention provides an output circuit for use in an analog-to-digital converter circuit, and the output circuit includes the interface circuit in the first aspect of the present invention.

A third aspect of the present invention provides an analog-to-digital converter circuit, and the analog-to-digital converter circuit includes the output circuit in the second aspect of the present invention.

A fourth aspect of the present invention provides an integrated circuit, including the interface circuit in the first aspect of the present invention, the output circuit in the second aspect of the present invention, or the analog-to-digital converter circuit in the third aspect of the present invention.

As described above, the interface circuit and the electronic apparatus of the present invention have the following beneficial effects:

Through the cooperation of the programmable current array and the common mode and differential mode generation circuit, the common mode voltage, the high level voltage, and the low level voltage are generated. The gating of the common mode and differential mode generation circuit and the differential mode generation circuit are adjusted by the current control signal of the programmable current array, so that the magnitude of the outputted common mode voltage and the amplitude of the differential mode voltage can be adjusted, which meets the design requirements of high performance integrated circuits.

REFERENCE NUMERALS

1—programmable current array;
2—common mode and differential mode generation circuit;
3—driving bias generation circuit;
4—output driving circuit;
5—electronic apparatus.

DETAILED DESCRIPTION

The embodiments of the present invention will be described below through specific examples. Those skilled in the art can easily understand other advantages and effects of the present invention according to the contents disclosed by the specification. The present invention may also be implemented or applied through other different specific implementation modes. Various modifications or changes may be made to all details in the specification based on different points of view and applications without departing from the spirit of the present invention. It needs to be stated that the following embodiments and the features in the embodiments can be combined with one another under the situation of no conflict.

It needs to be stated that the drawings provided in the following embodiments are just used for schematically describing the basic concept of the present invention, thus only illustrating components related to the present invention and are not drawn according to the numbers, shapes, and sizes of components during actual implementation, the configuration, number and scale of each component during the actual implementation thereof may be freely changed, and the component layout configuration thereof may be more complicated.

Figure 1:
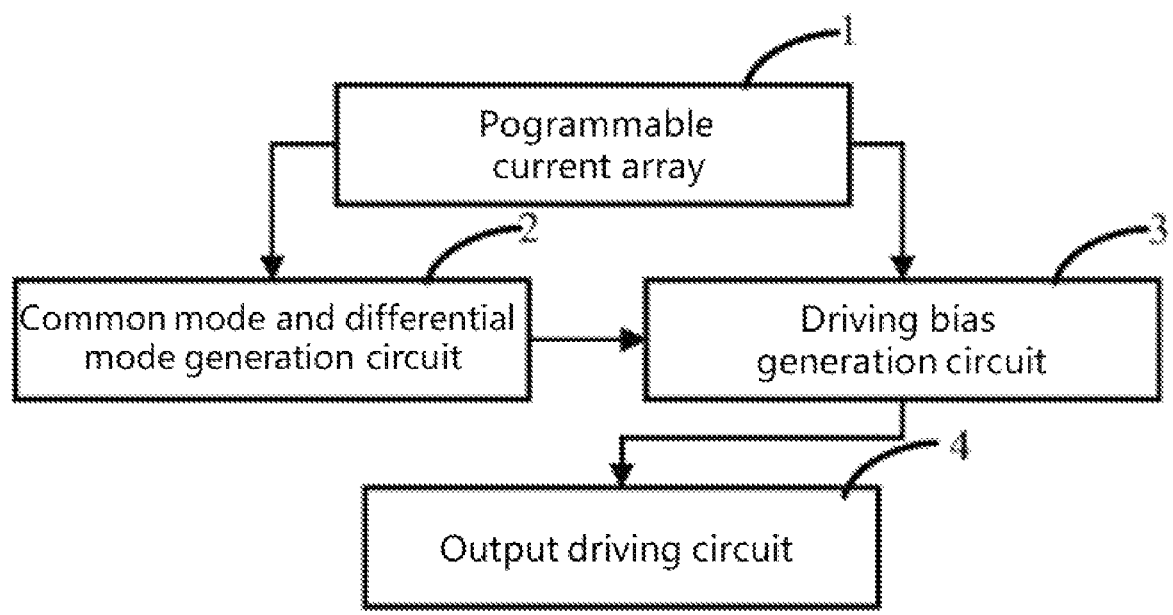
FIG. 1 shows a schematic structural diagram of an interface circuit according to an embodiment of the present invention.

FIG. 1 shows a schematic structural diagram of an interface circuit according to an embodiment of the present invention, including:

- a programmable current array 1, used to generate a first current and a second current transmitted to a common mode and differential mode generation circuit according to an input code, and to generate a third current and a fourth current transmitted to a driving bias generation circuit according to the input code;
- the common mode and differential mode generation circuit 2, connected to the output end of the programmable current array, used to generate a common mode voltage according to the first current, and to generate a high level voltage and a low level voltage according to the second current and the common mode voltage, where the difference between the high level voltage and the low level voltage is a differential mode voltage;
- a driving bias generation circuit 3, respectively connected to the output ends of the programmable current array and the common mode and differential mode generation circuit, used to simulate a load according to the third current and the fourth current, and to generate a bias voltage in a combination of the load, the high level voltage, and the low level voltage;
- an output driving circuit 4, connected to the bias voltage of the driving bias generation circuit, to convert an input signal into a differential signal in which the common mode voltage and a differential mode amplitude are configurable.

In this embodiment, the common mode voltage, the high level voltage, and the low level voltage are generated through a cooperation of the programmable current array and the common mode and differential mode generation circuit, where the current flowing into the common mode and differential mode generation circuit and the resistance used to generate a voltage can be adjusted by changing the current control signal of the programmable current array, so that the magnitude of the outputted common mode voltage and the amplitude of the differential mode voltage can be adjusted, which meets the design requirements of high performance integrated circuits.

Figure 2:
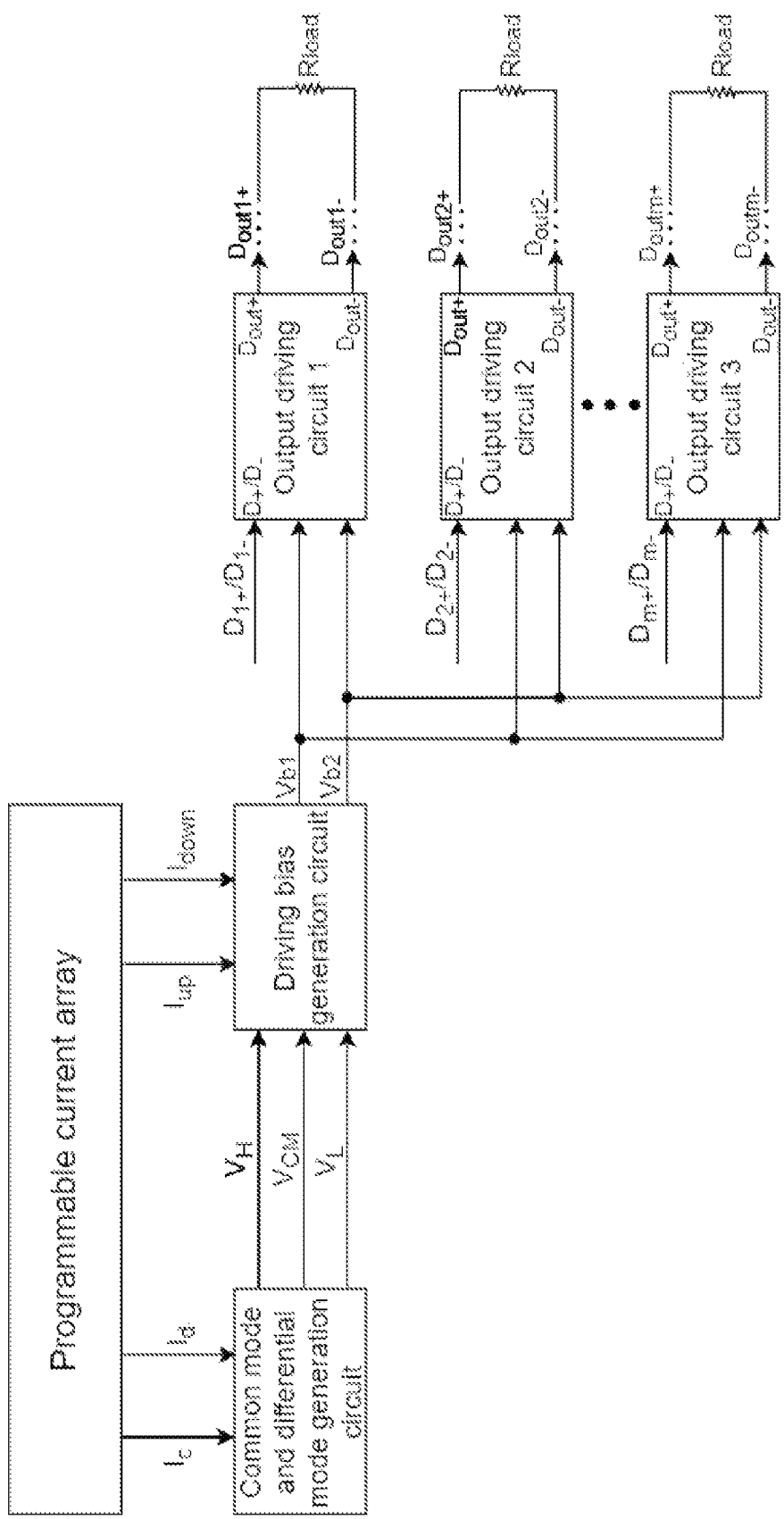
FIG. 2 shows a complete structural diagram of the interface circuit according to an embodiment of the present invention.

As shown in FIG. 2, the driving bias generation circuit 3 has the function of simulating the load and can generate the bias voltage. When the bias voltage is applied as a power supply, the output driving circuit converts the input signal into the differential signal in which the common mode voltage and the differential mode amplitude are configurable.

It should be noted that the output driving circuit includes a plurality of output driving modules, the driving bias generation circuit and the output driving circuit have mirrored circuits, and the bias voltage enables the driving bias generation circuit and the output driving circuit in the same working state, therefore, the differential signal in which the common mode voltage and the differential mode voltage amplitude are configurable is generated, where the common mode voltages of all the output driving modules are determined by the feedback loop of the operational amplifier in the driving bias generation circuit and the mirrored structure of the driving bias generation circuit.

In this embodiment, an indirect connection between an output common mode feedback circuit and the output driving circuit is achieved through the mirror structure, thus reducing the parasitic capacitance and improving the interface speed. In addition, there is no need to prepare a matched common mode feedback loop for each output driving circuit, and only a common operational amplifier is needed. The output common mode voltage of each output driving circuit can be determined through the mirror structure, thus greatly reducing the number of operational amplifiers and saving area and power consumption.

In another embodiment, the programmable current array is composed of a current source array, and outputs the first current $I_c$, the second current $I_d$, the third current $I_p$, and the fourth current $I_n$ that are controlled by switches.

Figure 3:
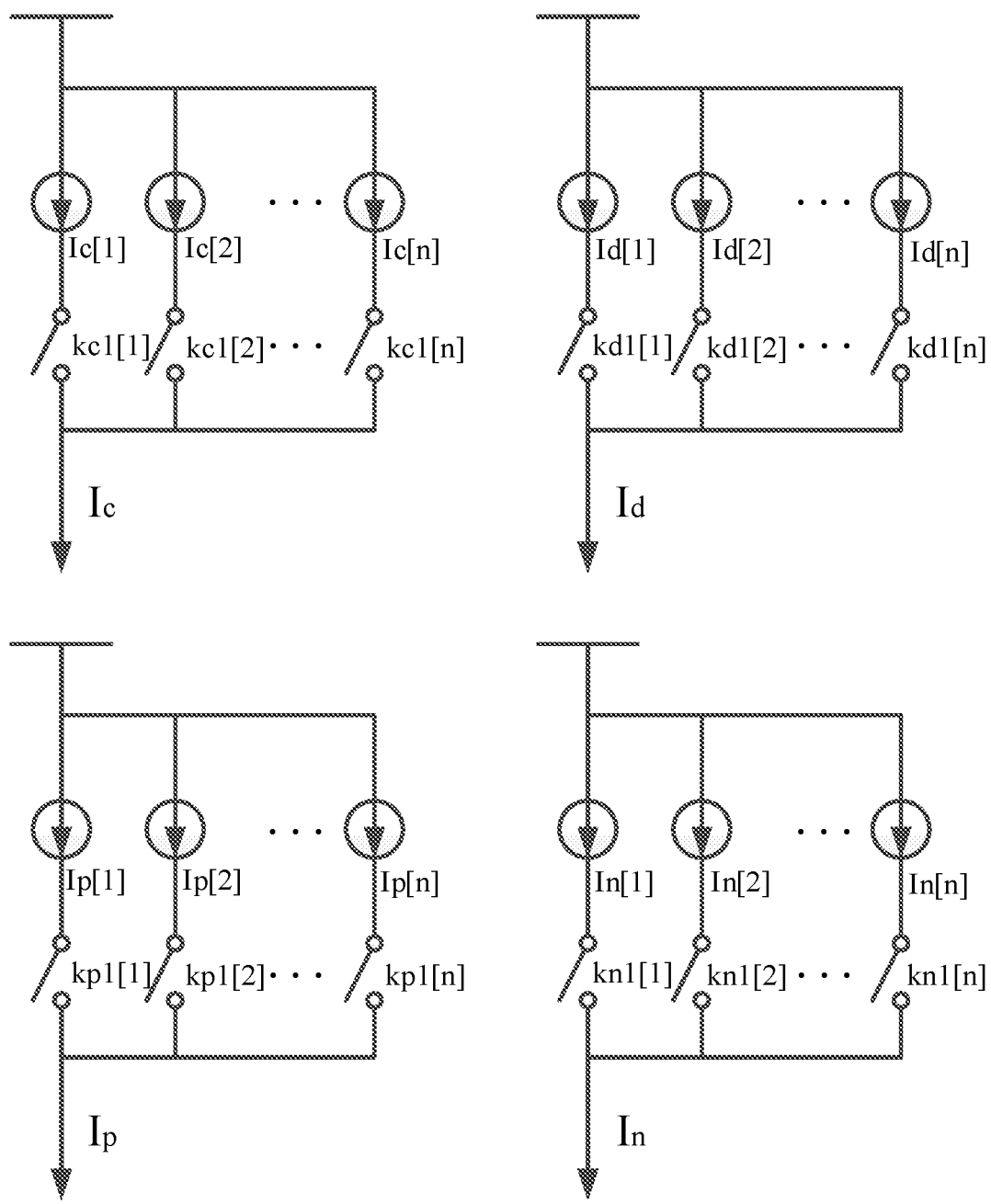
FIG. 3 shows a circuit diagram of a programmable current array according to an embodiment of the present invention.

It should be noted that the first current $I_c$, the second current $I_d$, the third current $I_p$, and the fourth current $I_n$ are generated in the same way. Please refer to FIG. 3, the specific connection relationship is as follows: N current sources are connected in parallel, the positive ends of the N current sources are connected in parallel and are connected to a power supply, the negative end of each current source is correspondingly connected to a switch, and the switch is turned on or off by a control signal, where the control signal is determined by the input code, and the output current of the current source array is controlled by the control signal. For example, the signal $k_{c1}[1]$ controls the switch corresponding to the current source $I_c[1]$. When $k_{c1}[1]$ is at a logic high level 1, the switch is turned on, and the current $I_c[1]$ flowing out is a part of the first current $I_c$. When $k_{c1}[1]$ is at a logic low level 0, the switch is turned off.

$$I_c = I_c[1]k_{c1}[1] + I_c[2]k_{c1}[2] + \ldots + I_c[n]k_{c1}[n] = \sum_{i=1}^{n} I_c[i]k_{c1}[i]$$

$$I_d = I_d[1]k_{d1}[1] + I_d[2]k_{d1}[2] + \ldots + I_d[n]k_{d1}[n] = \sum_{i=1}^{n} I_d[i]k_{d1}[i]$$

$$I_p = I_p[1]k_{p1}[1] + I_p[2]k_{p1}[2] + \ldots + I_p[n]k_{p1}[n] = \sum_{i=1}^{n} I_p[i]k_{p1}[i]$$

$$I_n = I_n[1]k_{n1}[1] + I_n[2]k_{n1}[2] + \ldots + I_n[n]k_{n1}[n] = \sum_{i=1}^{n} I_n[i]k_{n1}[i]$$

Figure 4:
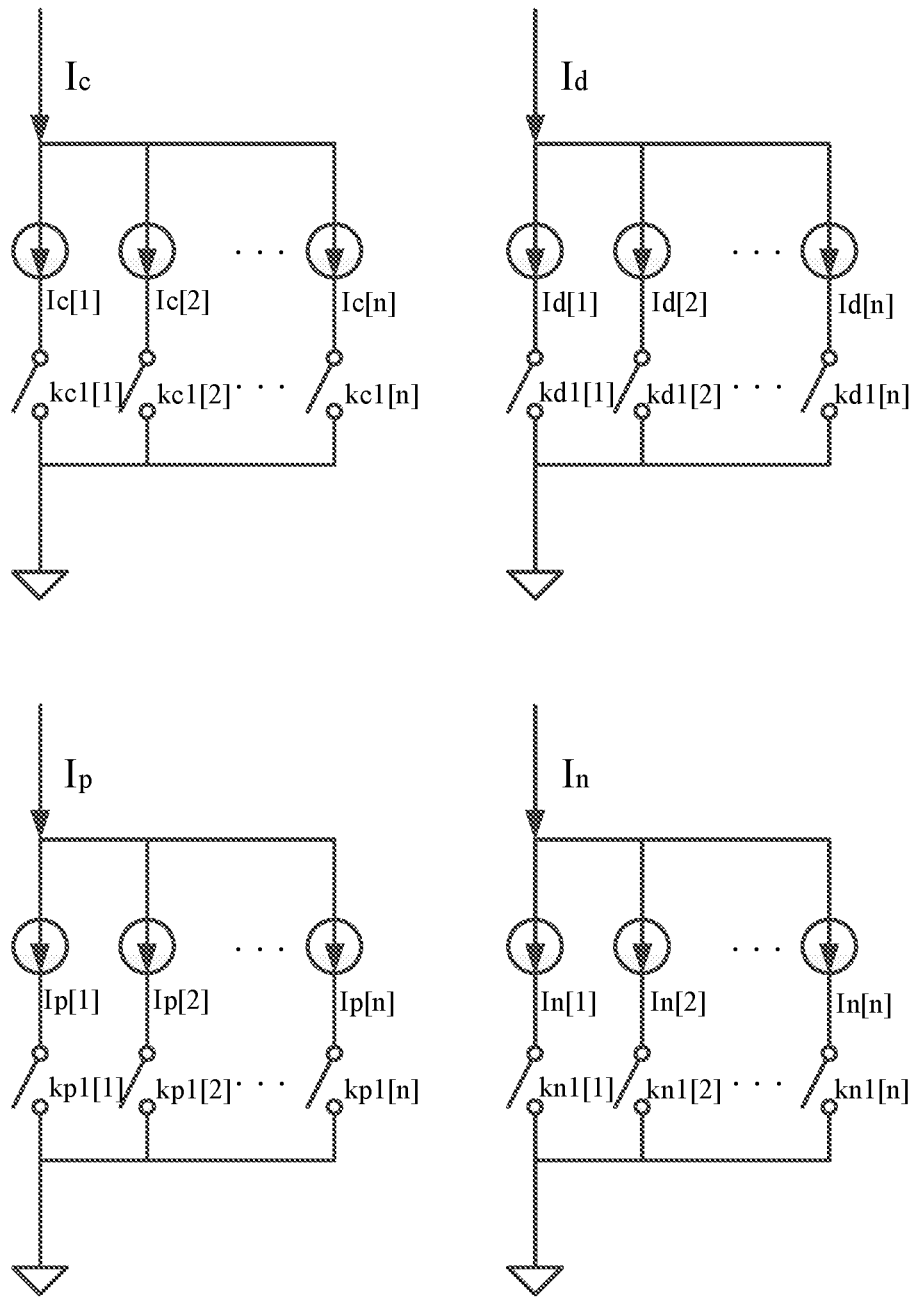
FIG. 4 shows a circuit diagram of a programmable current array according to another embodiment of the present invention.

In another embodiment, please refer to FIG. 4, for example, the signal $k_{c1}[1]$ controls the switch corresponding to the current source $I_c[1]$. When $k_{c1}[1]$ is at a logic high level 1, the switch is turned on, and the current $I_c[1]$ flowing out is a part of the first current $I_c$. When $k_{c1}[1]$ is at a logic low level 0, the switch is turned off.

In this embodiment, the switches in the current source array are controlled by the input code, i.e., the current source generates a current (such as the first current $I_c$, the second current $I_d$, the third current $I_p$ and the fourth current $I_n$) with controllable magnitude according to different switch control signals, so as to meet various application requirements of the user, improve the control accuracy of the output current, and expand the range of the output current.

Figure 5:
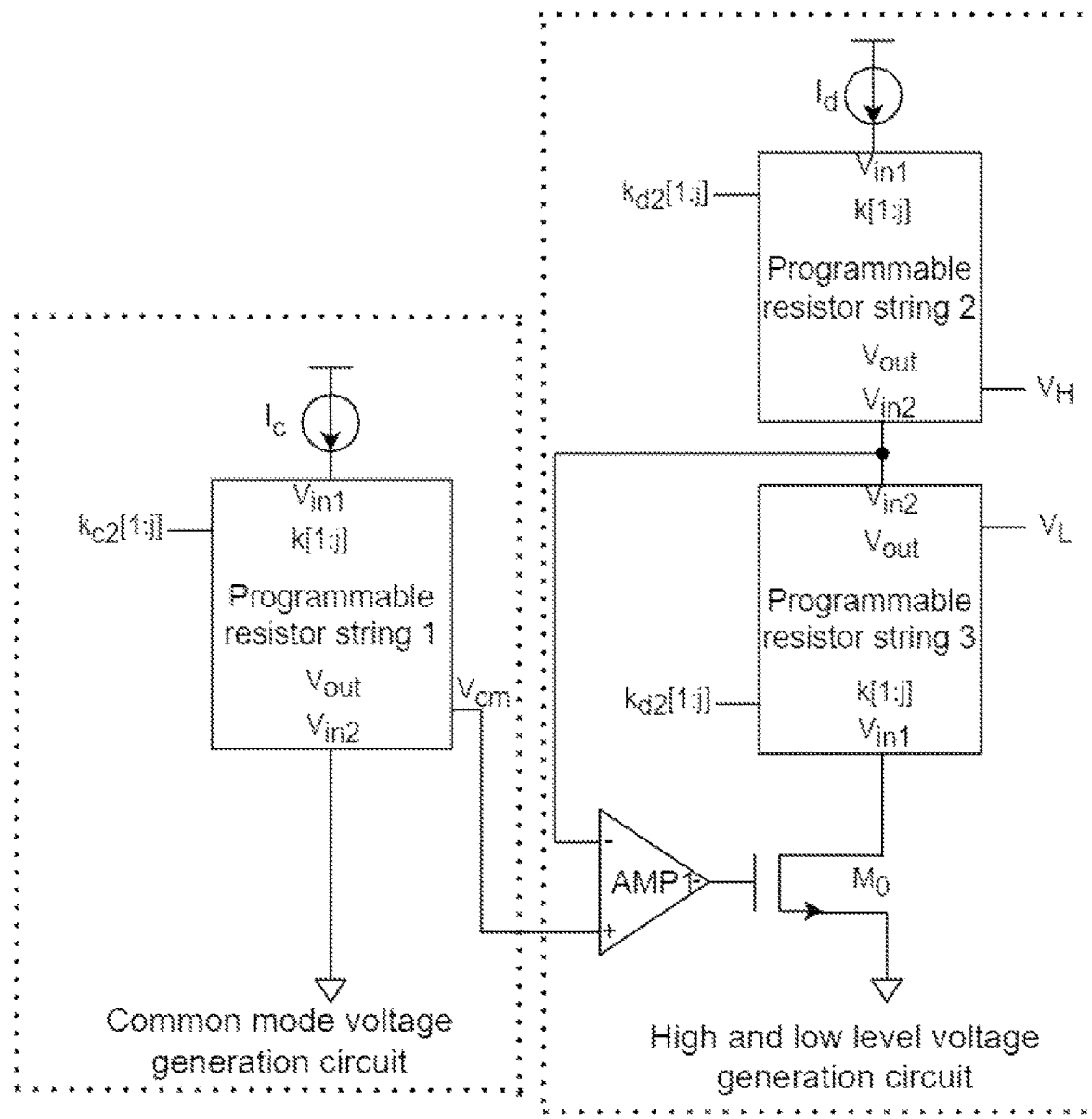
FIG. 5 shows a circuit diagram of a common mode and differential mode generation circuit according to an embodiment of the present invention.

FIG. 5 shows a circuit diagram of the common mode and differential mode generation circuit according to an embodiment of the present invention, which is described below.

The first current $I_c$ flowing from the programmable current array is used to generate a common mode voltage $V_{cm}$, and the second current $I_d$ flowing from the programmable current array and the common mode voltage $V_{cm}$ are used to generate a high level voltage $V_H$ and a low level voltage $V_L$. Referring to FIG. 5, a common mode level generation circuit and a high and low level generation circuit are shown.

The common mode level generation circuit includes a current source $I_c$ (i.e., the first current $I_c$) and a first programmable resistor string, where a positive end of the current source $I_c$ is connected to a power supply, a negative end of the current source $I_c$ is connected to a first input end Vin1 of the first programmable resistor string, a control end of the first programmable resistor string is controlled by a control signal $k_{c2}[1:j]$, and a second input end Vin2 of the first programmable resistor string is grounded. The output end of the first programmable resistor string outputs the common mode voltage $V_{cm}$.

In this embodiment, the first current $I_c$ flows through the first programmable resistor string to generate the common mode voltage $V_{cm}$, which is output to the high and low level generation module. The common mode voltage $V_{cm}$ can be adjusted by changing the control signal $k_{c1}[1:n]$ of the first current $I_c$ and a level gating control signal $k_{c2}[1:j]$. Therefore, a flexible configuration of the output signal "common mode voltage" is realized through the cooperation of the programmable current source array and the programmable resistor strings, and the number of configurable step length is n*j, thus achieving an accuracy adjustment of the output common mode voltage $V_{cm}$.

The high and low level generation circuit includes a current source $I_d$ (i.e., the second current $I_d$), a second programmable resistor string, a third programmable resistor string, a first operational amplifier AMP1, and a MOS transistor $M_0$. The positive end of the current source $I_d$ is connected to a power supply, and the negative end of the current source $I_d$ is connected to the first input end Vin1 of the second programmable resistor string. The second input end Vin2 of the second programmable resistor string is connected in series with the second input end Vin2 of the third programmable resistor string, the control end of the second programmable resistor string is controlled by the control signal $k_{d2}[1:j]$, and the control end of the third programmable resistor string is controlled by the control signal $k_{d2}[1:j]$. The negative end of the first operational amplifier AMP1 is connected between the second programmable resistor string and the third programmable resistor string, and the output end of the first operational amplifier AMP1 is connected to the gate of the MOS transistor $M_0$. The source of the MOS transistor $M_0$ is grounded, and the drain of the MOS transistor $M_0$ is connected to the first input end Vin1 of the third programmable resistor string. The output end of the second programmable resistor string outputs the high level voltage $V_H$, and the output end of the third programmable resistor string outputs the low level voltage $V_L$.

In this embodiment, the second current $I_d$ flows through the second programmable resistor string 2, the third programmable resistor string 3, and the transistor $M_0$. The high level voltage $V_H$ and the low level voltage $V_L$ are obtained under the action of the operational amplifier AMP1 and its feedback loop. The common mode voltage (i.e., $V_{cm}$) of the high level voltage $V_H$ and the low level voltage $V_L$ is determined by the loop feedback of the operational amplifier. The amplitude of the differential mode voltage ($V_H$-$V_L$) can be adjusted by changing the control signal $k_{d1}[1:n]$ of $I_d$ and the level gating control signal $k_{d2}[1:j]$. Therefore, the number of configurable step length is n*j, thus achieving an accuracy adjustment of the output common mode voltage ($V_H$-$V_L$).

Figure 6:
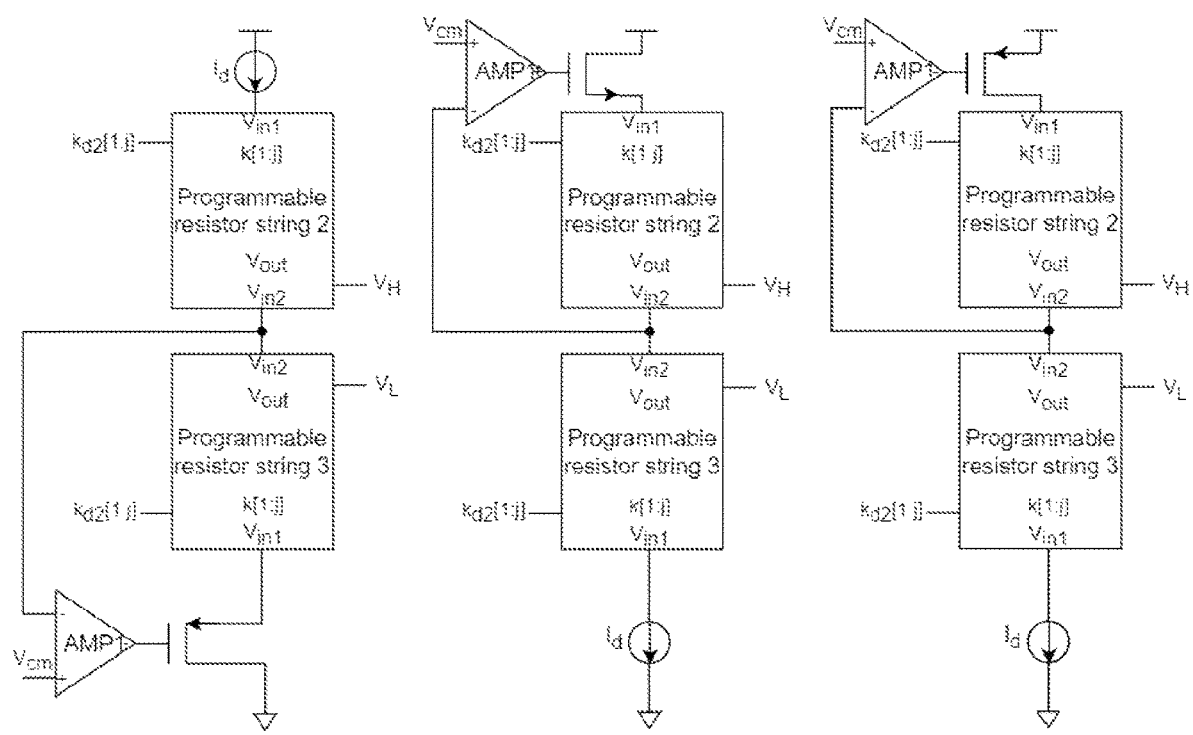
FIG. 6 shows a circuit diagram of a high and low level generation circuit according to an embodiment of the present invention.

FIG. 6 shows a circuit diagram of the high and low level generation circuit according to other embodiments of the present invention, which is implemented in other ways and described below.

In a first embodiment of the high and low level generation circuit, compared with the above embodiment as described in FIG. 5, the difference is that the MOS transistor $M_0$ is changed from an NMOS transistor to a PMOS transistor, where the source of the PMOS transistor is connected to the first input end Vint of the third programmable resistor string, and the drain of the PMOS transistor is grounded.

In a second embodiment of the high and low level generation circuit, compared with the above embodiment as described in FIG. 5, the difference is that the connection positions of the current source $I_d$ and the MOS transistor $M_0$ are exchanged, for example, the drain of the MOS transistor $M_0$ is connected to the power supply, the source of the MOS transistor $M_0$ is connected to the first input end Vint of the second programmable resistor string, the first input end Vint of the third programmable resistor string is connected to the positive end of the current source $I_d$, and the negative end of the current source $I_d$ is grounded.

In a third embodiment of the high and low level generation circuit, compared with the above embodiment as described in FIG. 5, the difference is that the MOS transistor $M_0$ is changed from an NMOS transistor to a PMOS transistor, where the drain of the PMOS transistor is connected to the first input end Vint of the second programmable resistor string, and the source of the PMOS transistor is grounded.

In this embodiment, the high level voltage $V_H$ and the low level voltage $V_L$ can be generated through various implementations of the programmable current source array and the programmable resistor strings, where the common mode voltage $V_{CM}$ of the high level voltage $V_H$ and the low level voltage $V_L$ is determined by the loop feedback of the operational amplifier, the amplitude of the differential mode voltage ($V_H$-$V_L$) can be adjusted by changing the control signal $k_{d1}[1:n]$ of $I_d$ and the level gating control signal $k_{d2}[1:j]$. Therefore, the flexible configuration of the output signal "common mode voltage" is realized through the cooperation of the programmable current source array and the programmable resistor strings, and the number of configurable step length is n*j, thus achieving an accuracy adjustment of the output common mode voltage ($V_H$-$V_L$).

Figure 7:
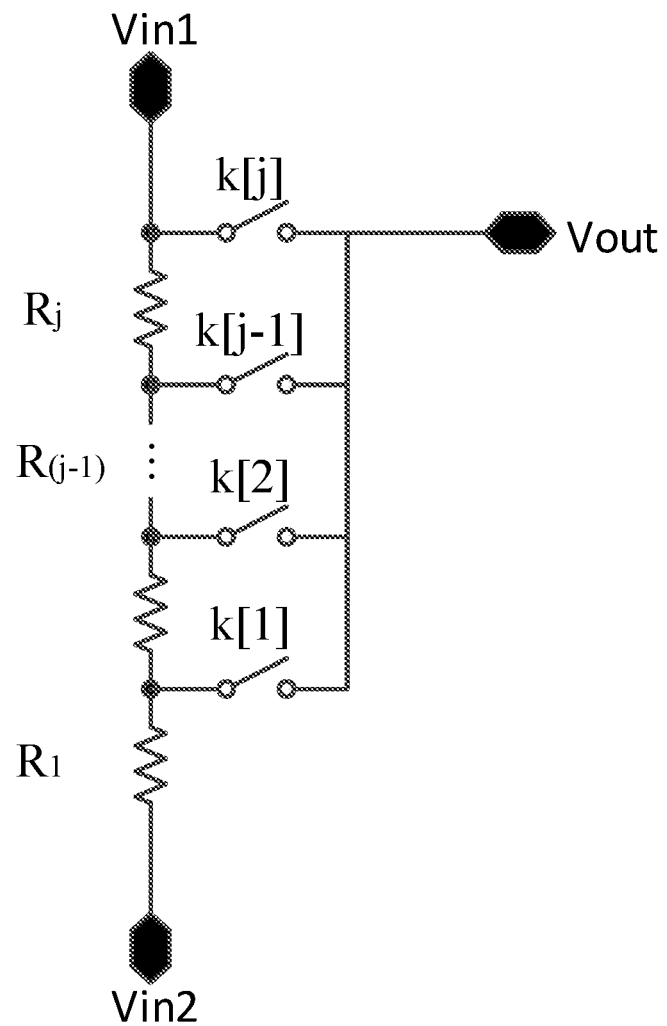
FIG. 7 shows a circuit diagram of a programmable resistor string according to an embodiment of the present invention.

FIG. 7 shows a circuit diagram of the programmable resistor string according to an embodiment of the present invention, where the structures of the first programmable resistor string, the second programmable resistor string, and the third programmable resistor string are the same, for example, any one of the programmable resistor strings includes a first resistor $R_1$, a second resistor $R_2$, ..., a $j_{th}$ resistor a control switch k[1:j], a first input end Vin1, a second input end Vin2, and an output end Vout, where j is greater than or equal to 1.

It should be noted that the first input end Vin1 of the programmable resistor string is connected to a first end of the $j_{th}$ resistor R; and a first end of the $j_{th}$ control switch k[j] respectively, and the resistors from R; to $R_1$ are connected in series. A second end of the first resistor $R_1$ is connected to the second input end Vin2 of the programmable resistor string, the (j−1)th control switch k[j−1] is connected between the $j_{th}$ resistor R; and the (j−1)th resistor and the first control switch k[1] is connected between the second resistor $R_2$ and the first resistor $R_1$ similarly. The second ends of the first control switch k[1] to the $j_{th}$ control switch k[j] are connected to the output end Vout of the programmable resistor string.

In this embodiment, various application requirements of the user are met, the programming accuracy of the resistor is improved, and the programmable range of the resistor is expanded.

Figure 8:
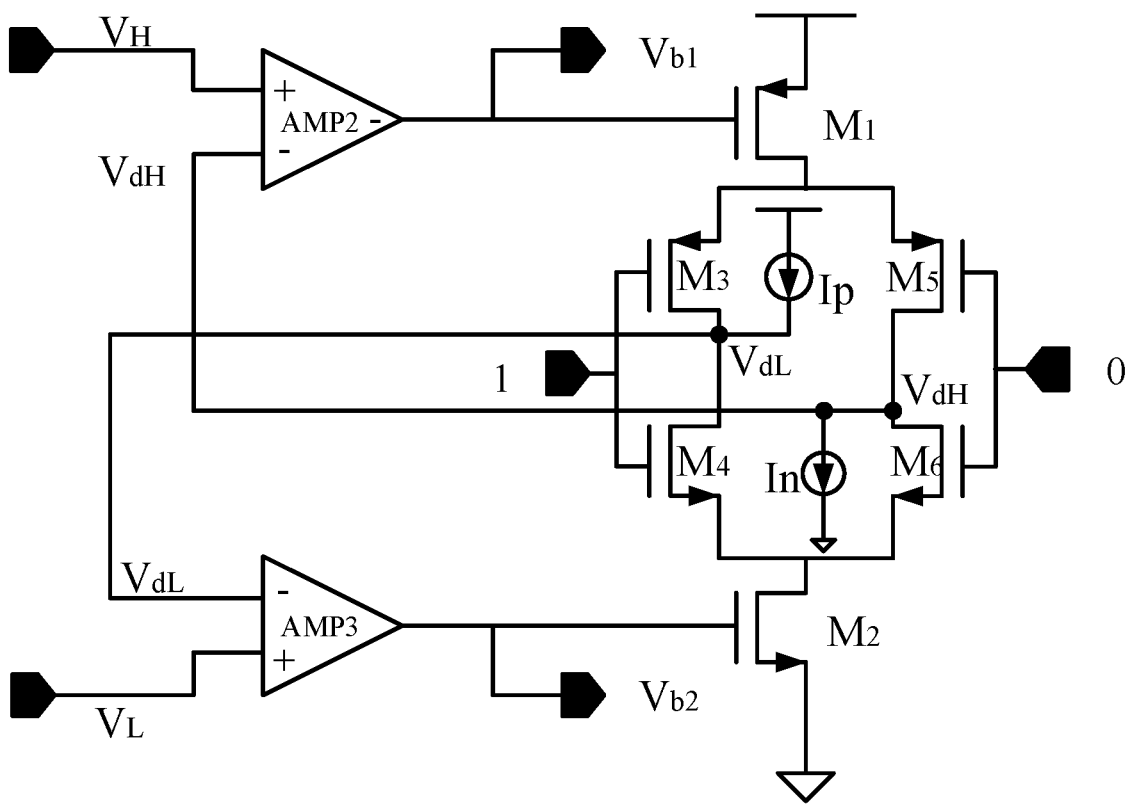
FIG. 8 shows a circuit diagram of a driving bias generation circuit according to an embodiment of the present invention.

FIG. 8 shows a circuit diagram of a driving bias generation circuit according to an embodiment of the present invention.

The driving bias generation circuit 3 employs the third current $I_p$ and the fourth current $I_n$ flowing from the programmable current array to simulate the load. A first bias voltage $V_{b1}$ and a second bias voltage $V_{b2}$ are generated according to the load combined with the high level voltage $V_H$ and the low level voltage $V_L$ generated by the common mode and differential mode generation circuit. The first bias voltage $V_{b1}$ and the second bias voltage $V_{b2}$ are output to the output driving circuit.

It should be noted that the driving bias generation circuit 3 includes a second operational amplifier AMP2, a third operational amplifier AMP3, transistors $M_1$-$M_6$, the current source $I_p$ (i.e., the third current $I_p$), and the current source $I_n$ (i.e., the fourth current $I_n$), where the first transistor $M_1$, the third transistor $M_3$, and the fifth transistor $M_5$ are PMOS transistors, and the second transistor $M_2$, the fourth transistor $M_4$, and the sixth transistor $M_6$ are NMOS transistors. The positive end of the second operational amplifier AMP2 is connected to the high level voltage $V_H$ output by the common mode and differential mode generation circuit 2, the negative end of the second operational amplifier AMP2 is connected to the drains of the fifth transistor $M_5$ and the sixth transistor $M_6$ and the current source $I_n$ (the fourth current), and the negative-phase output end of the second operational amplifier AMP2 is connected to the gate of the first transistor $M_1$ (the first bias voltage $V_{b1}$). The positive end of the third operational amplifier AMP3 is connected to the low level voltage $V_L$ output by the common mode and differential mode generation circuit 2, the negative end of the third operational amplifier AMP3 is connected to the drains of the third transistor $M_3$ and the fourth transistor $M_4$ and the current source $I_p$ (the third current), and the positive-phase output end of the third operational amplifier AMP3 is connected to the gate of the second transistor $M_2$ (the second bias voltage $V_{b2}$). The gates of the third transistor $M_3$ and the fourth transistor $M_4$ are connected to the logic high level 1, and the gates of the fifth transistor $M_5$ and the sixth transistor $M_6$ are connected to the logic low level 0. The first bias voltage $V_{b1}$ is determined by the second operational amplifier AMP2 feedback loop, and the second bias voltage $V_{b2}$ is determined by the third operational amplifier AMP3 feedback loop.

In this embodiment, the current source $I_p$ and the current source $I_n$ are used to simulate the current situation when an actual load is applied. When a resistor as the actual load is applied, due to that the gates of the third transistor $M_3$ and the fourth transistor $M_4$ are connected to the logic high level 1, the third transistor $M_3$ is turned off, the fourth transistor $M_4$ is turned on, the current flows from the load to the ground via the fourth transistor $M_4$ and the second transistor $M_2$, and the third current $I_p$ is used to simulate the current flowing from the load to the fourth transistor $M_4$. In addition, due to that the gates of the fifth transistor $M_5$ and the sixth transistor $M_6$ are connected to the logic low level 0, the fifth transistor $M_5$ is turned on, the sixth transistor $M_6$ is turned off, the current flows from the first transistor $M_1$ and the fifth transistor $M_5$ to the ground via the load, and the fourth current $I_n$ is used to simulate the current flowing from the fifth transistor $M_5$ to the load.

It should be noted that the transistor in the present invention can be a field effect transistor, and can also be a bipolar transistor, which will not be described herein again.

Due to the feedback effect of the second operational amplifier AMP2, the $V_H$ is equal to the $V_{dH}$ ($V_H$=$V_{dH}$), due to the feedback effect of the third operational amplifier AMP3, the $V_L$ is equal to the $V_{dL}$ ($V_L$=$V_{dL}$); therefore, the amplitude of the outputted signal of the driving bias generation circuit 3 ($V_{dH}$-$V_{dL}$) is equal to that of the high and low level generation circuit ($V_H$-$V_L$), i.e., the adjustment of ($V_{dL}$-$V_{dL}$) is realized by adjusting ($V_H$-$V_L$).

Due to that the third current $I_p$ and the fourth current $I_n$ are used to simulate the current flowing through the load, the third current source $I_p$ is equal to the fourth current source $I_n$. When adjusting the amplitude of the signal ($V_H$-$V_L$), the current flowing through the load changes proportionally with the change of the amplitude of the outputted signal due to the constant impedance of the load. Therefore, $I_p$ and $I_n$ should be adjusted proportionally when adjusting the amplitude of the outputted signal ($V_H$-$V_L$), so as to realize an accurate simulation of the current flowing through the load.

Figure 9:
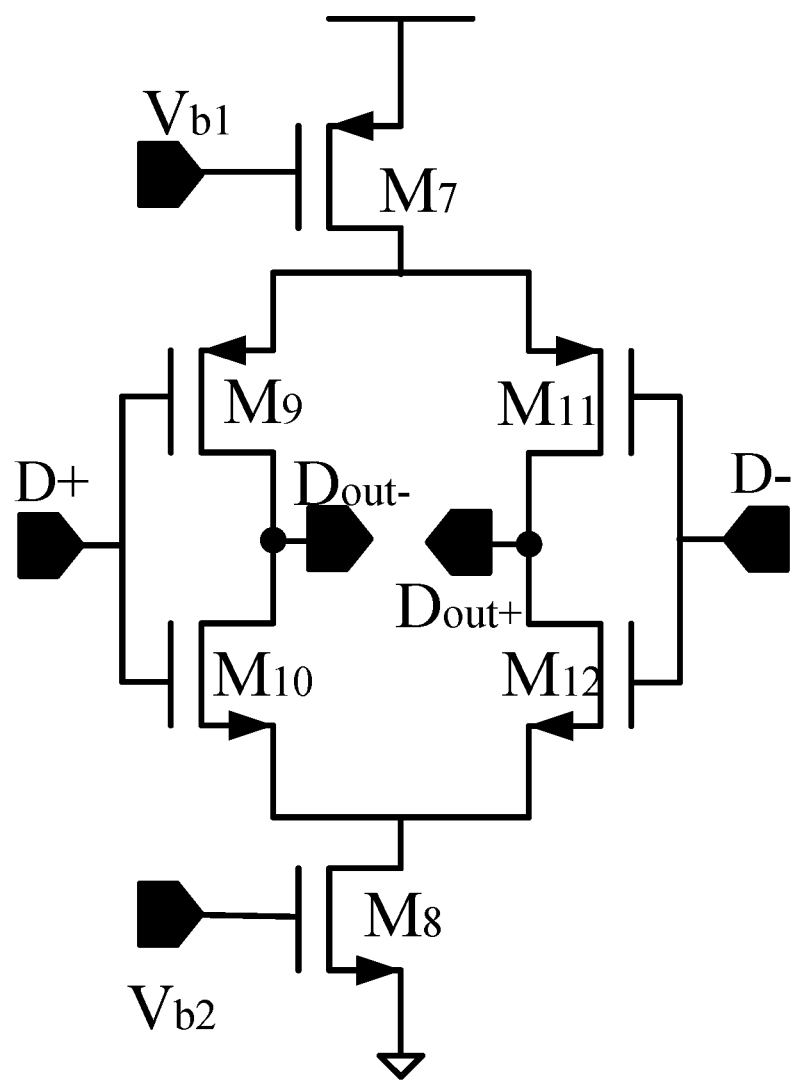
FIG. 9 shows a circuit diagram of an output driving circuit according to an embodiment of the present invention.

FIG. 9 shows a circuit diagram of an output driving circuit according to an embodiment of the present invention.

The output driving circuit, as shown in FIG. 2, includes an output driving circuit (an output driving module) 41, an output driving circuit 42, . . . , and an output driving circuit 4m. The output driving circuit 41 converts CMOS input signals D1+ and D1− into a pair of differential signals $D_{out}1+$ and $D_{out}1-$, and $D_{out}1+$ and $D_{out}1-$ in which the common mode voltage and the differential mode amplitude are configurable are outputted. The output driving circuit 42 converts CMOS input signals D2+ and D2− into a pair of differential signals $D_{out}2+$ and $D_{out}2-$, and $D_{out}2+$ and $D_{out}2-$ in which the common mode voltage and the differential mode amplitude are configurable are outputted; . . . ; the output driving circuit 4m converts CMOS input signals Dm+ and Dm− into a pair of differential signals $D_{out}m+$ and $D_{out}m-$, and $D_{out}m+$ and $D_{out}m-$ in which the common mode voltage and the differential mode amplitude are configurable are outputted.

The structures of the output driving module 41, the output driving module 42, . . . , and the output driving module 4m are the same. As shown in FIG. 9, each of the output driving modules includes transistors $M_7$-$M_{12}$, where the seventh transistor $M_7$, the ninth transistor $M_9$, and the eleventh transistor $M_{11}$ are PMOS transistors, and the eighth transistor $M_8$, the tenth transistor $M_{10}$, and the twelfth transistor $M_{12}$ are NMOS transistors.

The gate of the seventh transistor $M_7$ is connected to the first bias voltage $V_{b1}$, the gate of the eighth transistor $M_8$ is connected to the second bias voltage $V_{b2}$, the source of the seventh transistor $M_7$ is connected to the power supply, and the source of the eighth transistor $M_8$ is grounded. The gates of the ninth transistor $M_9$ and the tenth transistor $M_{10}$ are connected to a first digital input logic level D+, the gates of the eleventh transistor $M_{11}$ and the twelfth transistor $M_{12}$ are connected to a second digital input logic level D−, where the drain of the seventh transistor $M_7$ is connected to the sources of the ninth transistor $M_9$ and the eleventh transistor $M_{11}$, respectively, and the drain of the eighth transistor $M_8$ is connected to the sources of the tenth transistor $M_{10}$ and the twelfth transistor $M_{12}$, respectively. The first output end $D_{out}+$ of the output driving module is connected with the drains of the eleventh transistor $M_{11}$ and the twelfth transistor $M_{12}$, and the second output end $D_{out}-$ of the output driving module is connected with the drains of the ninth transistor $M_9$ and the tenth transistor $M_{10}$. The device size of the transistor $M_7$-$M_{12}$ is proportional to the size and current density of the transistors $M_1$-$M_6$ in the driving bias generation circuit 3, and the first bias voltage $V_{b1}$ and the second bias voltage $V_{b2}$ are generated by the driving bias generation circuit 3 on the premise that an analog load is applied, therefore, the working state of the output driving circuit is completely consistent with that of the driving bias generation circuit 3, and the amplitude of the outputted signal can be expressed as follows:

$$[(D_{out}+)-(D_{out}-)]=(V_{dH}-V_{dL})=(V_H-V_L)$$

where $V_H$ is the high level voltage, $V_L$ is the low level voltage, and $(V_{DL}-V_{dL})$ is the amplitude of the outputted signal of the driving bias generation circuit.

In this embodiment, the output common mode voltage and the differential mode amplitude of the output driving circuit 4 can be determined based on the mirror structures between the driving bias generation circuit 3 and the output driving circuit 4 combined with the bias voltages $V_{b1}$ and $V_{b2}$ enabling the working state of the driving bias generation circuit 3 the same as that of the output driving circuit 4. Therefore, it is no longer necessary to use operational amplifiers to determine its output common mode voltage in the output driving circuit 4. As for m output driving modules, it is only necessary to use operational amplifiers in the driving bias generation circuit 3 with an analog load to determine the outputted common mode level and differential mode voltage of all output driving modules through the feedback and mirrored structure. While in the traditional structure, each output driving module needs to be equipped with an operational amplifier, i.e., m operational amplifiers are required. Thus, the present invention greatly reduces the number of operational amplifiers and saves area and power consumption. In addition, the output driving circuit is not directly connected to the common mode feedback loop, which reduces the parasitic capacitance of the output node and improves the speed of the output driving circuit.

Figure 10:
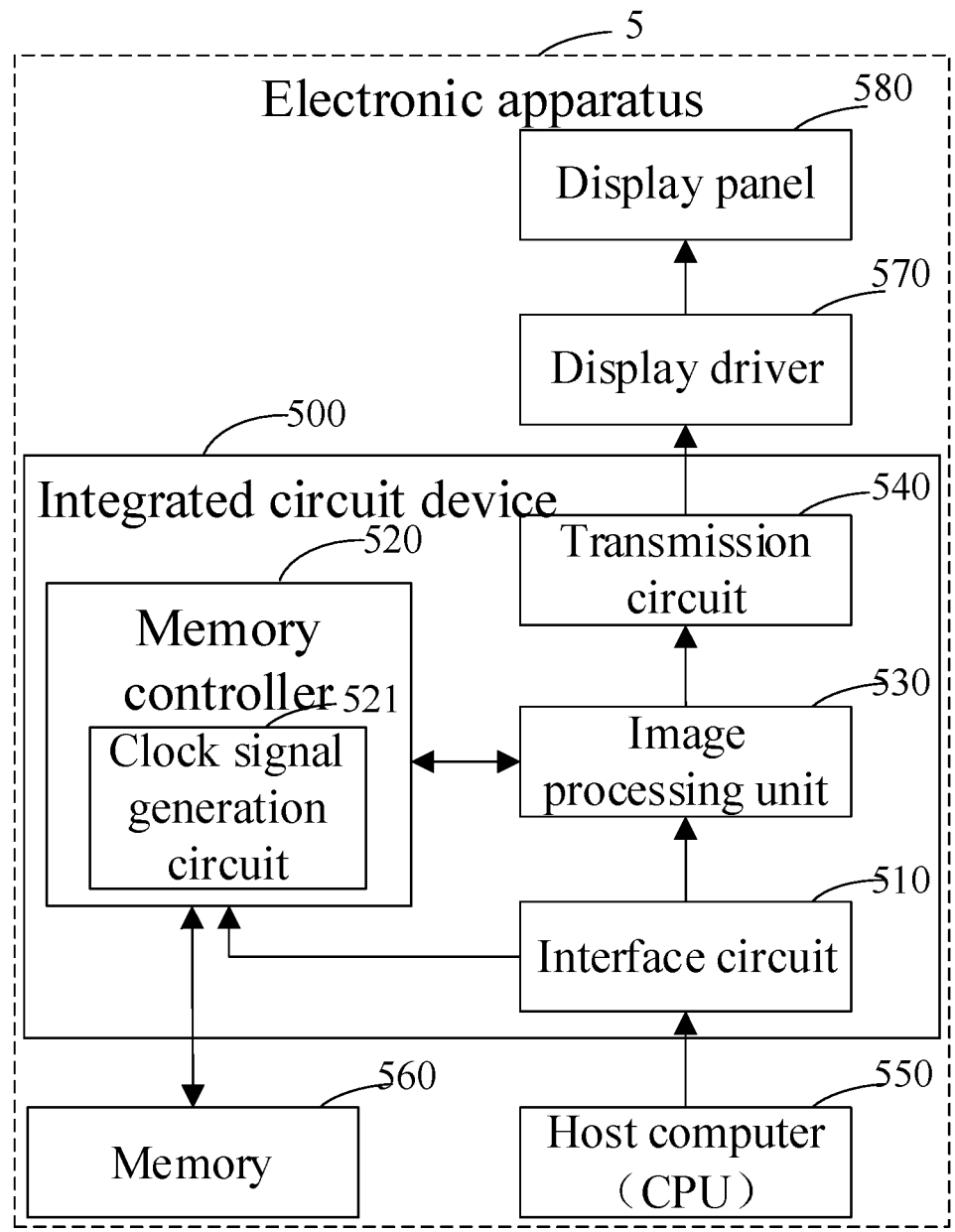
FIG. 10 shows a circuit diagram of an electronic apparatus according to an embodiment of the present invention.

FIG. 10 shows an electronic apparatus employing the interface circuit according to an embodiment of the present invention, such as a TV, a mobile phone, a tablet, a computer, or the like with a display panel 580 (for example, an LCD, an LED, an OLED, or the like).

The serial data or clock signal from a host computer 550 is sent to an integrated circuit device 500 through the differential signal line (universal serial bus) of the LVDS, and is received by an interface circuit 510 (LVDS receiving circuit). In an embodiment, the interface circuit 510 sends the clock signal transmitted from the host computer 550 (or a clock signal that sequentially doubles the clock signal) to a memory controller 520. In an embodiment, the received serial data (the image data) transmitted from the host computer 550 is sent to an image processing unit 530.

The image processing unit 530 performs various image processing, such as gamma correction and the like, on the image data received from the host computer 550. In an embodiment, employing a memory 560 (broadly speaking, it is a device operating according to the data or clock signal received from the interface circuit) to process the image, and the image data before or after processing can be written into the memory 560 or read out from the memory 560. The memory 560 can be a high speed memory, for example, SDRAM, DDRSDRAM, or the like. The writing of data to such memory 560 or the reading of data from the memory 560 is realized by the control of the memory controller 520 (SDRAM).

A clock signal generation circuit 521 of the memory controller 520 generates a clock signal for sampling the read data from the memory 560 based on, for example, a clock signal from the interface circuit 510. Alternatively, a clock signal required to write data to the memory 560 can be generated.

The image data processed by the image processing unit 530 is transmitted to a display driver 570 (a device operating according to the data received by the interface circuit or a clock signal) through a transmission circuit 540. In addition, the display driver 570 drives the display panel 580 based on the received image data and performs control on the image for displaying the corresponding image data.

The configuration of the electronic apparatus to which the interface circuit of this embodiment applicable is not limited to the configuration shown in FIG. 10, but can be any apparatus including at least a device (for example, a memory, a display driver, a display panel, or the like) that operates on the basis of the data or clock signal received through the interface circuit. In an embodiment, various devices such as an information processing device, a portable information terminal, an AV device, a portable AV device, a game device, a portable game device, or the like may be considered as the electronic apparatus to which the present embodiment is applicable.

The description above illustrates that the interface circuit or differential interface circuit of the present invention can also be applied to an analog-to-digital conversion circuit.

In other embodiments, the circuit of the present invention may be implemented as an integrated circuit, such as an integrated circuit on the IC chip of the flip chip. The present invention can not only be applied to integrated circuits and IC chips as described above, but also to circuit boards including such IC chips, communication networks (e.g., Internet fiber optic network and wireless network) including such circuit boards, and network devices including such communication networks.

The common mode voltage, the high level voltage, and the low level voltage are generated through a cooperation of the programmable current array and the common mode and differential mode generation circuit, where the gating of the common mode and differential mode generation circuit and the differential mode generation circuit are controlled by the current control signal of the programmable current array, therefore, the magnitude of the outputted common mode voltage and the amplitude of the differential mode voltage can be adjusted, which meets the design requirements of high performance integrated circuits. The present invention effectively overcomes various shortcomings in the traditional technology and has high industrial utilization value.

The above mentioned embodiments are merely illustrative of the principle and effects of the present invention instead of limiting the present invention. Modifications or variations of the above-described embodiments may be made by those skilled in the art without departing from the spirit and scope of the invention. Therefore, all equivalent modifications or changes made by those skilled in the art without departing from the spirit and scope of the invention will be covered by the appended claims.

What is claimed is:

1. An interface circuit, comprising:
a programmable current array, used to generate a first current and a second current transmitted to a common mode and differential mode generation circuit according to an input code, and to generate a third current and a fourth current transmitted to a driving bias generation circuit according to the input code;
the common mode and differential mode generation circuit, connected to an output end of the programmable current array, used to generate a common mode voltage according to the first current, and to generate a high level voltage and a low level voltage according to the second current and the common mode voltage, wherein the difference between the high level voltage and the low level voltage is a differential mode voltage;
a driving bias generation circuit, connected to output ends of the programmable current array and the common mode and differential mode generation circuit, respectively, to simulate a load according to the third current and the fourth current, and to generate a bias voltage based on the load, the high level voltage, and the low level voltage;
an output driving circuit, connected to the bias voltage of the driving bias generation circuit, to convert an input signal into a differential signal in which a common mode voltage and a differential mode amplitude are configurable.

2. The interface circuit according to claim 1, wherein the programmable current array comprises a current source array, and outputs the first current, the second current, the third current, and the fourth current whose magnitudes are controlled by a plurality of switches.

3. The interface circuit according to claim 1, wherein the common mode and differential mode generation circuit comprises a common mode level generation circuit and a high and low level generation circuit connected in series with each others; wherein the common mode level generation circuit outputs the common mode voltage accurately by adjusting a switch control signal of the first current and a control signal of the common mode level generation circuit, and the high and low level generation circuit outputs the differential mode voltage accurately by adjusting a switch control signal of the second current and a control signal of the high and low level generation circuit.

4. The interface circuit according to claim 3, wherein the common mode level generation circuit includes the first current and a first programmable resistor string, and outputs the common mode voltage accurately by employing the switch control signal of the first current and a control signal of the first programmable resistor string.

5. The interface circuit according to claim 3, wherein the high and low level generation circuit includes the second current, a second programmable resistor string, a third programmable resistor string, a first operational amplifier, and a first MOS transistor, wherein the second current, the second programmable resistor string, the third programmable resistor string and the first MOS transistor are connected in series with each other; a positive end of the first operational amplifier is connected to the common mode voltage, a negative end of the first operational amplifier is connected between the second programmable resistor string and the third programmable resistor string to form an operational amplifier feedback loop; wherein the differential mode voltage is accurately outputted by employing a switch control signal of the second current and control signals of the second programmable resistor string and the third programmable resistor string.

6. The interface circuit according to claim 5, wherein the driving bias generation circuit is used to generate a simulated current when there is a load by employing the third current and the fourth current, and generates a first bias voltage and a second bias voltage as determined by feedback loops of operational amplifiers using the simulated current when there is a load, the high level voltage, and the low level voltage.

7. The interface circuit according to claim 1, wherein the third current and the fourth current are adjusted proportionally with the change of the amplitude of an outputted signal based on a constant impedance of the load, so that the simulation of the current when there is the load is accurate.

8. The interface circuit according to claim 6, wherein the driving bias generation circuit comprises two operational amplifiers comprising a second operational amplifier, and a third operational amplifier, a first transistor $M_1$, a second transistor $M_2$, a third transistor $M_3$, a fourth transistor $M_4$, a fifth transistor $M_5$, and a sixth transistor $M_6$, wherein a positive end of the second operational amplifier is connected to the high level voltage $V_H$, a negative end of the second operational amplifier is connected to drains of the fifth transistor $M_5$ and the sixth transistor $M_6$ and the fourth current, and a negative-phase output end of the second operational amplifier is connected to a gate of the first transistor $M_1$ and outputs the first bias voltage $V_{b1}$; wherein a positive end of the third operational amplifier is connected to the low level voltage $V_L$, a negative end of the third operational amplifier is connected to drains of the third transistor $M_3$ and the fourth transistor $M_4$ and the third current, and a positive-phase output end of the third operational amplifier is connected to a gate of the second transistor $M_2$ and outputs the second bias voltage $V_{b2}$; and wherein gates of the third transistor $M_3$ and the fourth transistor $M_4$ are connected to a logic high level 1, and gates of the fourth transistor $M_4$ and the sixth transistor $M_6$ are connected to a logic low level 0.

9. The interface circuit of claim 8, wherein the first bias voltage is determined by a feedback loop of the second operational amplifier, and the second bias voltage is determined by a feedback loop of the third operational amplifier.

10. The interface circuit of claim 8, wherein an amplitude of an outputted signal of the driving bias generation circuit is equal to that of the high and low level generation circuit $((V_{dH}-V_{dL}) (V_H-V_L))$, and wherein the $V_H$ is equal to the $V_{dH}$ $(V_H=V_{dH})$ on the basis of the feedback loop of the second operational amplifier, and the $V_L$ is equal to the $V_{dL}$ $(V_L=V_{dL})$ on the basis of the feedback loop of the third operational amplifier.

11. The interface circuit according to claim 1, wherein the differential signal in which the common mode voltage and the differential mode amplitude are configurable is generated, on the basis of mirrored structures between the driving bias generation circuit and the output driving circuit and bias voltages enabling the working state of the driving bias generation circuit the same as that of the output driving circuit.

12. The interface circuit according to claim 8, wherein the output driving circuit comprises a plurality of output driving modules, and the output driving modules and transistors of the driving bias generation circuit have mirrored structures, wherein each of the plurality of output driving modules is proportional to the driving bias generation circuit in terms of device size and current density, and a ratio of the device size of each of the plurality of output driving modules to the device size of the driving bias generation circuit is the same as a ratio of the current density of each of the plurality of output driving modules to the current density of the driving bias generation circuit.

13. The interface circuit according to claim 12, wherein each of the plurality of output driving modules comprises a seventh transistor $M_7$, an eighth transistor $M_8$, a ninth transistor $M_9$, a tenth transistor $M_{10}$, an eleventh transistor $M_{11}$, and a twelfth transistor $M_{12}$, wherein a gate of the seventh transistor $M_7$ is connected to a first bias voltage $V_{b1}$, a gate of the eighth transistor Mg is connected to a second bias voltage $V_{b2}$, a source of the seventh transistor $M_7$ is connected to a power supply, and a source of the eighth transistor $M_8$ is grounded; gates of the ninth transistor $M_9$ and the tenth transistor $M_{10}$ are connected to a first digital input logic level D+, and gates of the eleventh transistor Mu and the twelfth transistor $M_{11}$ are connected to a second digital input logic level D−; a drain of the seventh transistor $M_7$ is connected to sources of the ninth transistor $M_9$ and the eleventh transistor $M_{11}$, respectively, and a drain of the eighth transistor $M_8$ is connected to sources of the tenth transistor $M_{10}$ and the twelfth transistor $M_{12}$, respectively; a first output end $D_{out}$+ of the output driving module is connected to drains of the eleventh transistor $M_{11}$ and the twelfth transistor $M_{12}$, a second output end $D_{out}$− of the output driving module is connected to drains of the ninth transistor Mg and the tenth transistor $M_{10}$, and a signal amplitude between the first output end $D_{out}$+ and the second output end $D_{out}$− is:

$$[(D_{out}+)-(D_{out}-)]=(V_{dH}-V_{dL})=(V_H-V_L)$$

wherein $V_H$ is the high level voltage, $V_L$ is the low level voltage, and $(V_{dH}-V_{dL})$ is the output signal amplitude of the driving bias generation circuit.

14. The interface circuit according to claim 12, wherein the common mode voltage and the differential mode voltage of all the output driving modules are determined by feedback loops of operational amplifiers in the driving bias generation circuit and mirrored structures of the driving bias generation circuit.

15. An output circuit for use in an analog-to-digital converter circuit, comprising the interface circuit according to claim 1.

16. An analog-to-digital converter circuit, comprising the output circuit according to claim 15.

17. An integrated circuit, comprising: the interface circuit according to claim 1.

18. An integrated circuit, comprising: the output circuit according to claim 15.

19. An integrated circuit, comprising: the analog-to-digital converter circuit according to claim 16.

* * * * *